US012119263B2

(12) United States Patent
Shibuya

(10) Patent No.: US 12,119,263 B2
(45) Date of Patent: Oct. 15, 2024

(54) METHODS AND APPARATUS FOR AN IMPROVED INTEGRATED CIRCUIT PACKAGE

(71) Applicant: Texas Instruments Incorporated, Dallas, TX (US)

(72) Inventor: Makoto Shibuya, Beppu (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 594 days.

(21) Appl. No.: 17/317,845

(22) Filed: May 11, 2021

(65) Prior Publication Data
US 2021/0265214 A1    Aug. 26, 2021

Related U.S. Application Data

(63) Continuation of application No. 15/462,881, filed on Mar. 19, 2017, now Pat. No. 11,004,742.

(51) Int. Cl.
*H01L 23/495* (2006.01)
*H01L 21/48* (2006.01)
(Continued)

(52) U.S. Cl.
CPC .......... *H01L 21/78* (2013.01); *H01L 21/4842* (2013.01); *H01L 23/3107* (2013.01);
(Continued)

(58) Field of Classification Search
CPC ......... H01L 21/78; H01L 24/09; H01L 24/32; H01L 24/49; H01L 2224/04042;
(Continued)

(56) References Cited

U.S. PATENT DOCUMENTS 7,691,676 B1    4/2010  Fan et al.
9,078,381 B2 *  7/2015  You ................... H01L 23/49562
(Continued)

FOREIGN PATENT DOCUMENTS

CN        101133491         2/2008
CN        101133491 A  *    2/2008
(Continued)

OTHER PUBLICATIONS

CN Office Action mailed Jan. 9, 2023, 2pgs.

*Primary Examiner* — Caleb E Henry
*Assistant Examiner* — Dilinh P Nguyen
(74) *Attorney, Agent, or Firm* — Dawn Jos; Frank D. Cimino

(57) ABSTRACT

In a described example, an integrated circuit (IC) package includes an IC die disposed on a die attach pad; a plurality of leads electrically connected to terminals on the IC die, the leads including a base metal; and molding compound material encapsulating portions of the IC die, the die attach pads, and the plurality of leads; the plurality of leads having a solder joint reinforcement tab. The solder joint reinforcement tabs include a first side, a second side opposite to the first side, a third side, a fourth side opposite to and in parallel to the third side, a fifth side forming an end portion of the solder joint reinforcement tab, the solder joint reinforcement tabs including a solderable metal layer on the second, third and fourth sides and on portions of the fifth side.

16 Claims, 8 Drawing Sheets

(51) Int. Cl.
  *H01L 21/78*     (2006.01)
  *H01L 23/00*     (2006.01)
  *H01L 23/31*     (2006.01)
  *H01L 21/56*     (2006.01)

(52) U.S. Cl.
  CPC .. *H01L 23/49548* (2013.01); *H01L 23/49582* (2013.01); *H01L 24/09* (2013.01); *H01L 24/32* (2013.01); *H01L 24/49* (2013.01); *H01L 21/561* (2013.01); *H01L 2224/04042* (2013.01); *H01L 2224/16245* (2013.01); *H01L 2224/29006* (2013.01); *H01L 2224/29144* (2013.01); *H01L 2224/29155* (2013.01); *H01L 2224/29164* (2013.01); *H01L 2224/32245* (2013.01); *H01L 2224/48091* (2013.01); *H01L 2224/48247* (2013.01); *H01L 2224/48465* (2013.01); *H01L 2224/73265* (2013.01); *H01L 2224/97* (2013.01); *H01L 2924/00014* (2013.01); *H01L 2924/181* (2013.01)

(58) Field of Classification Search
  CPC . H01L 2224/19144; H01L 2224/29155; H01L 2224/29164; H01L 2224/48091
  USPC .......................................................... 257/666
  See application file for complete search history.

(56) References Cited

U.S. PATENT DOCUMENTS

| | | | |
|---|---|---|---|
| 2006/0180904 A1* | 8/2006 | Ong | H01L 24/32 257/676 |
| 2008/0224290 A1 | 9/2008 | Abbott | |
| 2014/0306330 A1* | 10/2014 | Williams | H01L 23/49551 438/123 |
| 2014/0357022 A1 | 12/2014 | Stacey | |

FOREIGN PATENT DOCUMENTS

| | | | |
|---|---|---|---|
| CN | 101834166 | | 9/2010 |
| CN | 101834166 B | * | 3/2015 |

* cited by examiner

METHODS AND APPARATUS FOR AN IMPROVED INTEGRATED CIRCUIT PACKAGE

This application is a continuation of U.S. patent application Ser. No. 15/462,881, filed Mar. 19, 2017, the contents of which are herein incorporated by reference in its entirety.

TECHNICAL FIELD

This disclosure relates generally to integrated circuit packaging, and more particularly to formation of solder joint reinforcement tabs on an integrated circuit package.

BACKGROUND

Lead frame strips are used in manufacturing packaged integrated circuits. Lead frame strips are comprised of multiple individual lead frames connected together by saw streets. An embedded lead frame strip is a lead frame strip to which integrated circuit dies are attached and embedded in molding compound. Lead frame strips include lead frames with conductive lead frame leads and a die attach pad for attaching an integrated circuit die. The conductive lead frame leads can be mechanically connected for stability in processing, but are separated electrically prior to completion of the packaging process. Terminals on the integrated circuit dies are electrically connected to the lead frame leads prior to completion of the packaged integrated circuit. In some packaged integrated circuits, bond wires are used to couple the terminals on the integrated circuit dies to the leads of the lead frames. In other packaged integrated circuits, the terminals on the integrated circuit dies are directly mounted to the leads of the lead frames using conductive solder balls or columns.

Packaged integrated circuits (PICs) such as Small Outline No-Lead (SON) and Quad Flat No-Lead (QFN) PICs are packaged by attaching IC dies using die attach material to a metal lead frame strip, making electrical connection from the IC dies to the lead frame leads, encapsulating the IC dies and lead frame strip in molding compound, and then singulating the individual SON or QFN packages by separating the individual packages by cutting through the saw streets by sawing or laser cutting, an operation referred to as "singulation." The singulated SON or QFN PICs may then be soldered or connected electrically by other means to leads on a printed circuit board (PCB) that goes into a piece of electronic equipment. SON or QFN packages are referred to as "no lead" packages because the leads of the lead frame used for electrical connections between the PIC and a printed circuit board are located at the periphery of the PIC, and do not extend away from the package, as in prior packages such as J-lead and dual in-line (DIP) packages, saving area on the circuit board. Typically solder connections are formed between the terminals of the PIC and traces on the printed circuit board. QFN and SON packages are only slightly larger in board area than the integrated circuit die and are sometimes referred to as "near chip scale" packages, enabling smaller circuit board sizes and higher integration in end equipment.

Lead frame strips are typically made of a base metal such as copper or a copper alloy that is plated with a layer of solderable metal. The lead frame strips are sometimes referred to as "pre-plated" lead frame strips because the solderable metal layer can be provided on the lead frame strip by a lead frame manufacturer. One such solderable metal layer is an electroplated layer of nickel followed by an electroplated layer of palladium. Electroless and electroplated metal layers are sometimes used. Other solderable metals include silver, tin, gold, platinum, solder, and alloys thereof. The layer of solderable metal is intended to prevent oxidation of the lead frame base metal, which occurs when the base metal is exposed to air. Solder is not able to properly wet any oxidation layer that forms, and the solder cannot form a reliable solder joint to the oxidized base metal.

During singulation of the packaged integrated circuits, the layer of solderable metal and the base metal of the lead frame strips are cut through. The base metal of the lead frame is exposed on the sidewalls of the PICS during the singulation process, and may oxidize when exposed to air. Improvements are therefore desirable.

SUMMARY

In a described example, an integrated circuit (IC) package includes an IC die disposed on a die attach pad; a plurality of leads electrically connected to terminals on the IC die, each of the plurality of leads including a base metal; and molding compound material encapsulating portions of the IC die, the die attach pads, and the plurality of leads; the plurality of leads having a solder joint reinforcement tab extending from a periphery of the IC package. The solder joint reinforcement tab includes a first side extending longitudinally in a first direction, a second side opposite to and in parallel to the first side, a third side that is oriented in a second direction perpendicular to the first direction, a fourth side opposite to and in parallel to the third side, a fifth side forming an end portion of the solder joint reinforcement tab, the solder joint reinforcement tab including a solderable metal layer on the second, third and fourth sides and on portions of the fifth side.

DETAILED DESCRIPTION OF EXAMPLE EMBODIMENTS

Corresponding numerals and symbols in the different figures generally refer to corresponding parts unless otherwise indicated. The figures are not necessarily drawn to scale.

Figure 1A:
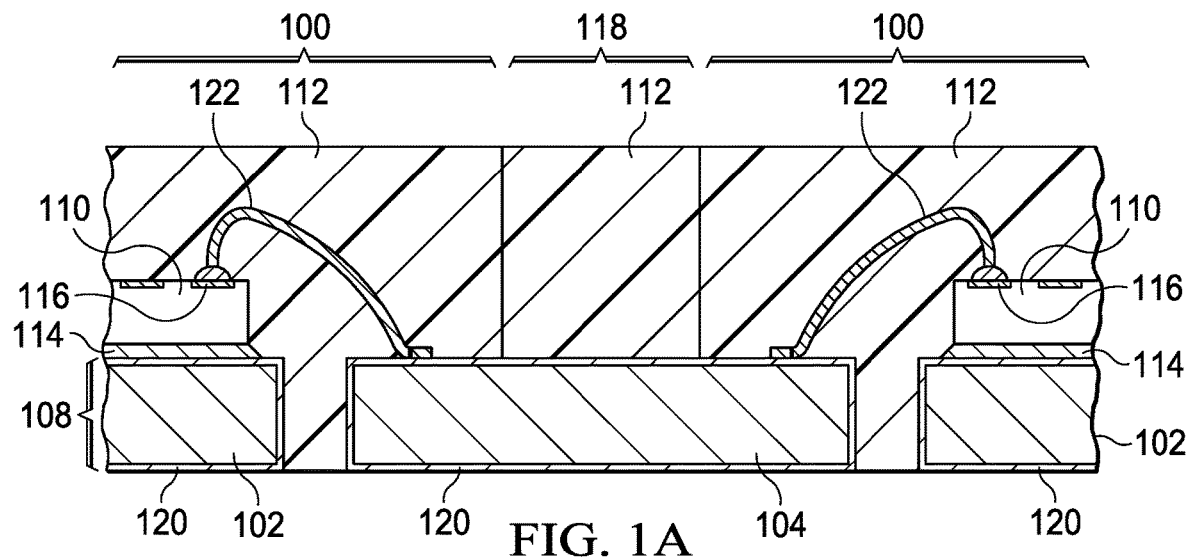
FIGS. 1A and 2A are cross sections of portions of lead frame strips with integrated circuit dies shown prior to singulation.

FIG. 1A is a cross section showing a lead frame strip 108. In the figures herein, the lead frame strips are shown with a frontside surface, which is the surface the IC dies are mounted on, facing upwards. The opposite surface, a backside surface of the lead frame strip, portions of which can form external terminals of the IC packages, is shown facing downwards in the figures. However, the orientation of the devices shown in the figures is for explanation, and does not affect the operation of the embodiments. In FIG. 1A lead frame strip 108 is shown having two IC dies 110 attached to a frontside surface of the lead frame strip 108. The ID dies are bonded by die attach material 114 to lead frame die mount pads 102. Bond wires 122 electrically connect terminals 116 of the integrated circuit dies 110 to lead frame leads 104. Portions of the IC dies 110, the bond wires 122, and the lead frame strip 108 are encapsulated in molding compound 112. The backside surface of the die mount pads 102 and the backside surface of lead frame leads 104 are not encapsulated with molding compound 112. Lead frame strip 108 includes solderable metal layer 120 on a base metal. Lead frame strip 108 can be provided to a packaging process including a pre-plated material that includes the solderable metal layer 120. Alternatively, the solderable metal layer 120 can be applied to the base metal of lead frame strip 108 at a prior step (not shown) in the packaging process. The integrated circuit dies 110 are spaced from one another by a saw street 112. Saw street 112 is a defined area of the lead frame strip 108 and the molding compound 112 where the integrated circuit devices can be separated in a later process step by cutting through the saw street. The exposed solderable metal layer 120 on the backside surface of the lead frame leads 104 and the die mount pads 102 form external PIC terminals 124 and 126 (see FIG. 1B). Solder joints (not shown in FIG. 1A) will be used to electrically connect these external PIC terminals 124 and 126 to leads on a printed circuit board (PCB) when the PICs are mounted for use.

Figure 1B:
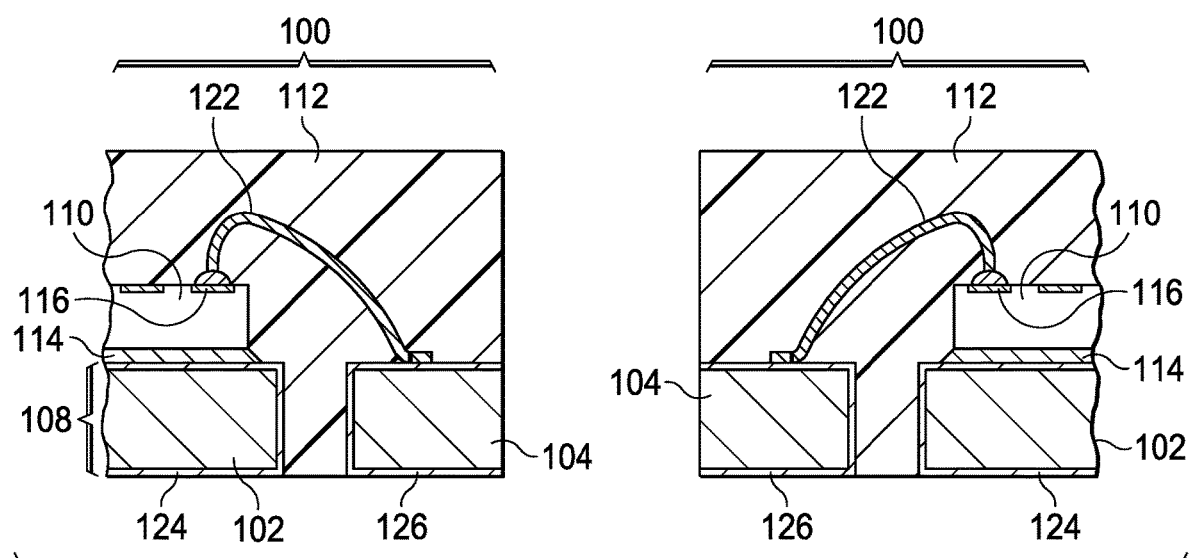
FIGS. 1B and 2B are cross sections of portions of lead frame strips with integrated circuit dies shown after singulation.

FIG. 1B is a cross section showing the two PICs 100 of FIG. 1A after the saw street 118 (FIG. 1A) is removed by sawing or laser cutting or other methods to singulate (singulation is the process of separating the plurality of molded IC dies mounted to the lead frame strip into single packaged ICs) the PICs 100. The singulation process cuts through the molding compound 112, the solderable metal layer 120 and the base metal of the lead frame strip 108, forming a sidewall on the PICs 100. Mechanical saws, laser cutting tools, and other methods can be used to singulate the PICs 100. The singulation can be done with one tool or alternatively, the singulation can be done with more than one type of tool or by a method performed in multiple steps.

Figure 2A:
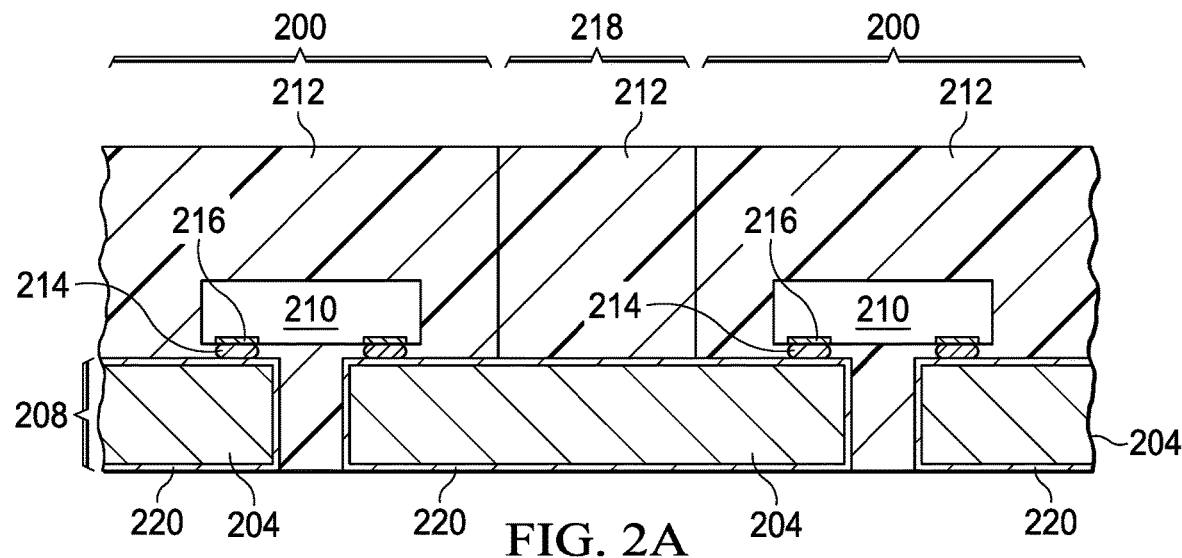

FIG. 2A is a cross section showing two integrated circuit dies 210 that are "flip chip" mounted (the integrated circuit dies are mounted with terminals 216 facing down) to lead frame leads 204 of a lead frame strip 208 using ball bonds 214. In FIG. 2, similar reference labels are used for similar elements shown in FIG. 1, for clarity. For example, molding compound 112 in FIG. 1 corresponds to the molding compound 212 in FIG. 2. In flip chip mounting the integrated circuit dies are described as "flipped" when compared to a wire bonded package, where the terminals 116 are arranged facing away from the lead frame 108 surface (see FIG. 1A). Portions of the lead frame strip 208, the IC dies 210, and the ball bonds 214 are encapsulated in molding compound 212. The two PICs 200 are joined together by saw street 218. Note that in a flip chip mounted package as shown in FIG. 2A, there is no die pad and no attachment to the die pad, the dies 210 are supported by the lead frame 208 at the terminals 216. Heat slugs or other thermal conductors can be used to make a thermal path from the dies 210. In another approach, thermally conductive filler particles can be incorporated into the molding compound 212 to improve heat conduction from the dies 210.

Figure 2B:
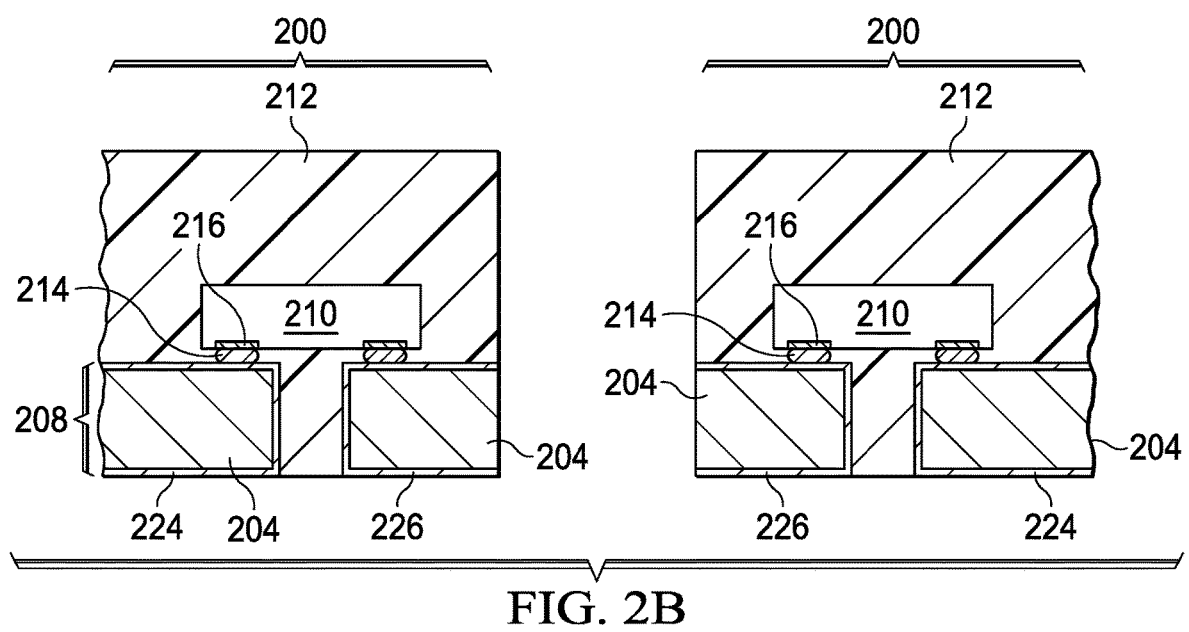

FIG. 2B is a cross section showing the two PICs 200 of FIG. 2A after the saw street 218 (FIG. 2A) is removed by sawing or laser cutting to singulate the PICS 200. The sawing cuts through the molding compound 212, the solderable metal layer 220 and the base metal of the lead frame strip 208 to form sidewalls on the singulated PICs 200. The bottom surfaces of the lead frame pads 204 are not encapsulated with molding compound 212. The solderable metal 220 on the bottom surfaces of the lead frame pads 204 remains exposed and forms external PIC terminals 224 and 226 (see FIG. 2B) that are used to attach the PICs 200 to leads on a PCB (not shown).

Lead frame strips 108 (FIG. 1A) and 208 (FIG. 2A) are typically made of a base metal such as copper or a copper alloy that is plated with a layer of solderable metal, shown as 120 and 220. One such solderable metal layer is an electroplated layer of nickel followed by an electroplated layer of palladium. Other solderable metals include silver, tin, gold, platinum, solder, and alloys thereof. ENIG (electroless nickel/immersion gold), ENEPIG (electroless nickel/electroless palladium/immersion gold) and other electroless and electroplated metal layers are used. Multiple layers of alternating materials are sometimes used in the layer of solderable metal to reduce the possibility of migration of copper ions from the base metal through the electroless or electroplated solderable material. The layer of solderable metal, 120 and 220, prevents oxidation of the lead frame base metal which occurs when the base metal is exposed to air. When oxidation occurs, solder is not able to properly wet the oxidation layer and form a reliable solder joint when the PICs are later installed to a printed circuit board (PCB) using a solder mounting process.

As is illustrated in the cross sections in FIGS. 1B and 2B, during singulation of the lead frame strips and the molding compound, the layer of solderable metal, 120 and 220, and the base metal of lead frame strips, 108 and 208, are cut through by sawing or laser cutting. The base metal of the lead frame, 108 and 208 in FIGS. 1 and 2, is then exposed on the sidewalls of the PICs 100 and 200 during singulation, and the exposed base metal may subsequently oxidize when exposed to air.

Figure 3:
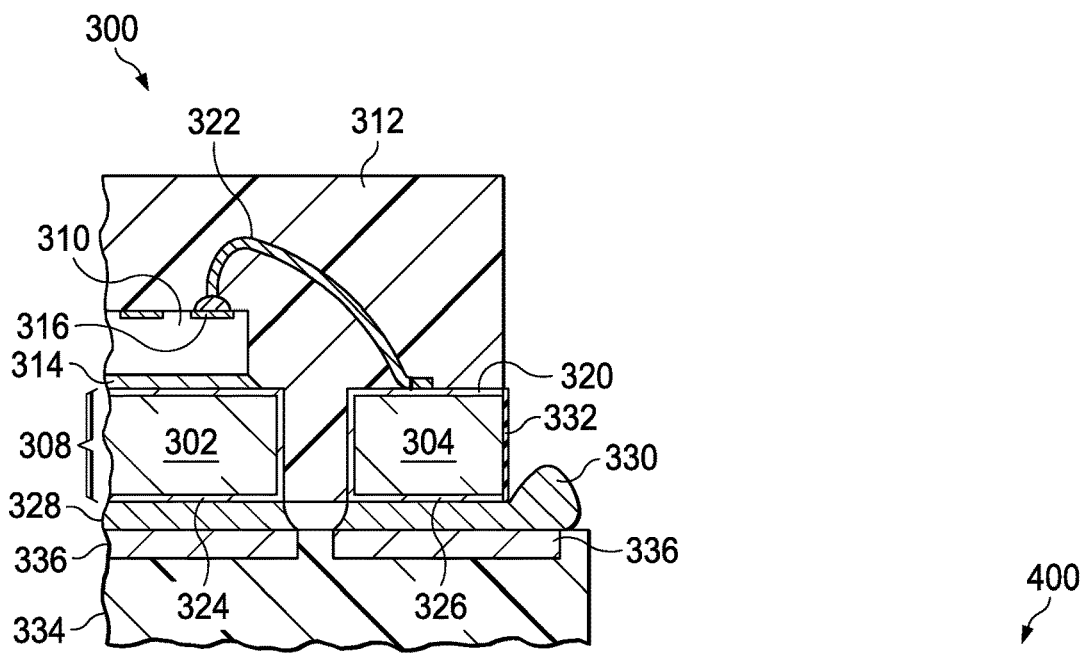
FIG. 3 is a cross section of a portion of an integrated circuit package soldered to leads on a printed circuit board (PCB).

FIG. 3 is a cross section of a PIC 300 soldered to a printed circuit board (PCB) 334 with solder joints 328 and 330. Note that in FIG. 3, similar reference labels are used for similar elements that are shown in FIG. 1, for clarity. For example, the integrated circuit die 310 in FIG. 3 corresponds to the integrated circuit dies 110 in FIG. 1. Integrated circuit die 310 includes terminal 316. Die attach 314 attaches the IC die 310 to die pad 302 of lead frame strip 308. Bond wire 322 electrically connects the terminal 316 to the lead frame lead 304. Molding compound 312 partially encapsulates the integrated circuit die 310, the bond wire 322, the lead frame strip 308 including the die pad 302 and the lead frame lead 304. Solder joints 328 and 330 connect external PIC terminals 324 and 326 on the bottom of the PIC 300 to conductive leads 336 on the surface of the PCB 334. The layer of solderable metal 320 covers the backside surfaces of the lead frame strip 307 and the terminals 324, 326 include solderable layer 320. As shown in FIG. 3, an oxide layer 332 may form on the vertical side of the lead frame lead 304 where the base metal is exposed during singulation. Solder 330 does not wet the oxide layer 332, preventing a strong, reliable solder joint 330 from forming.

Figure 4A:
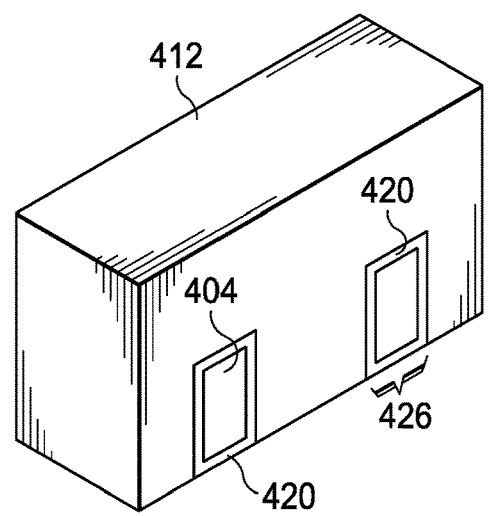
FIGS. 4A and 4B are perspective views of an integrated circuit package.

FIG. 4A is a perspective view of a PIC 400. FIG. 4A shows the sidewall of the PIC 400 that is exposed during singulation. The singulation cut forms the sidewall (see PIC 100 and PIC 200 in FIGS. 1B and 2B) which includes a vertical surface in molding compound 412 and in lead frame leads 404. A layer of solderable metal 420 encases the lead frame leads 404, except for the sidewall of the base metal of the lead frame leads 404 that is exposed during singulation. The sidewalls of the lead frame leads 404 that are exposed on the sidewall of the PIC 400 include base metal which oxidizes when exposed to air.

Figure 4B:
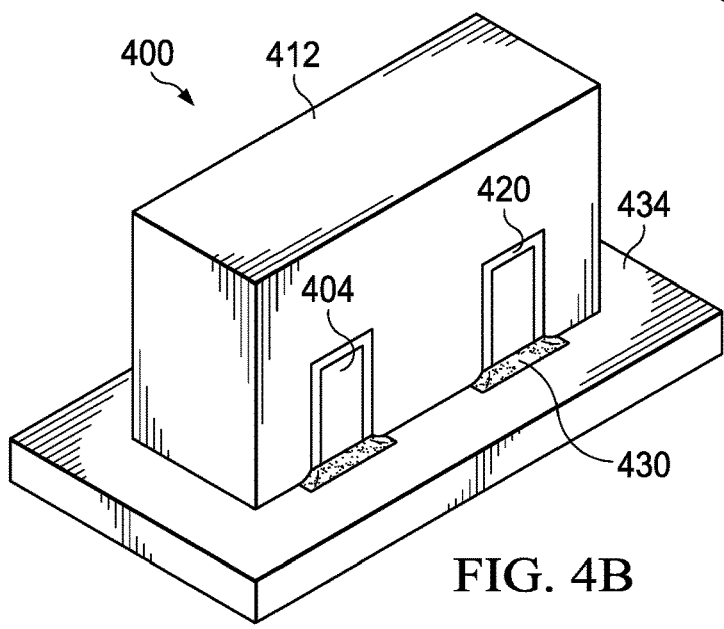

FIG. 4B is a perspective view that shows the PIC 400 of FIG. 4A after solder joints 430 are formed between the external terminals on the bottom of the lead frame leads 404 and conductive leads on a PCB 434. (The external terminals and the conductive leads on the PCB 434 cannot be seen in FIG. 4B as the solder 430 covers the conductive leads in this view). The solder 430 wets the solderable metal 420 that covers the external PIC terminals, but does not wet or adhere to the oxidation layer (see 332 in FIG. 3, for example) formed on exposed base metal on the sidewall of the lead frame leads 404. This solder joint, shown as 330 and 430 in FIGS. 3 and 4B, respectively, may be weak and may delaminate causing the PCB integrated circuit to fail. The delamination that can occur while the PCB is in use can cause field failures of the end equipment, necessitating repair or replacement of the end equipment.

Figure 5:
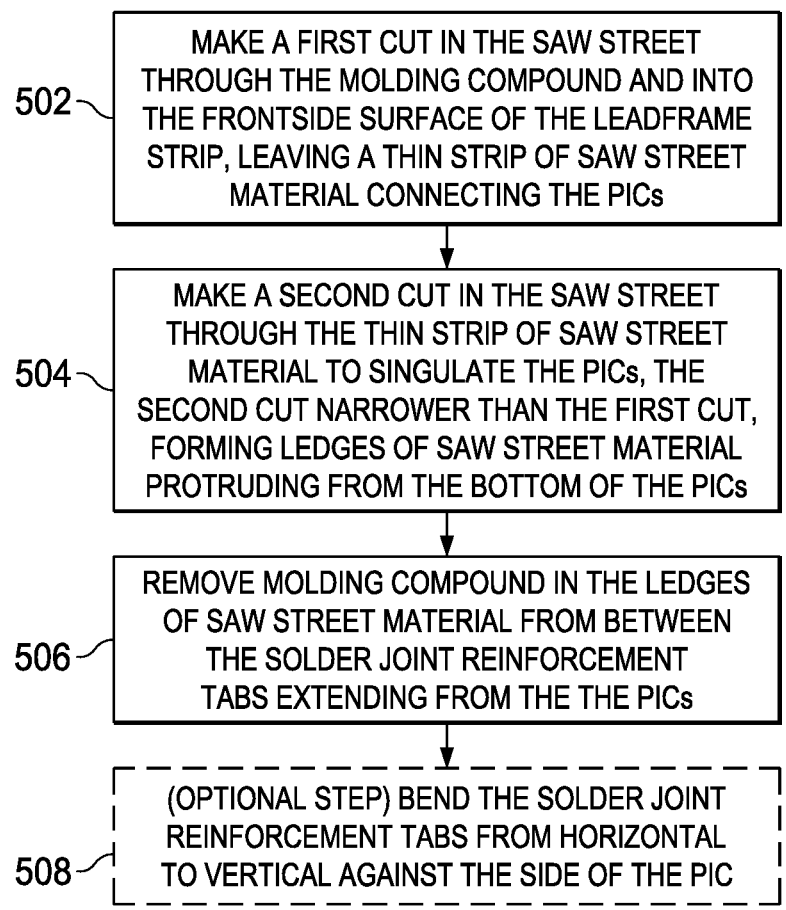
FIG. 5 is a flow diagram of an embodiment method for forming an integrated circuit package with solder joint reinforcement tabs.

FIG. 5 is a flow diagram of the major steps in the manufacture of PICS using an embodiment having solder joint reinforcement tabs (SJRTs).

In step 502, a first cut is made in the saw street from the frontside of the embedded lead frame strip. The first cut extends through the molding compound in the saw street and into the frontside surface of the lead frame strip in the saw street. In one example embodiment, the cuts were made using a wide singulation saw blade. (In an alternative embodiment, laser cutting may also be used, or in another alternative embodiment, multiple passes with a narrower saw blade can be used to form a wide cut. In addition, other methods to perform the first cut can be used.) Typically when cutting from the frontside of the lead frame strip, the backside of the embedded lead frame strip can be supported. One such means of support is a tape.

Figure 6A:
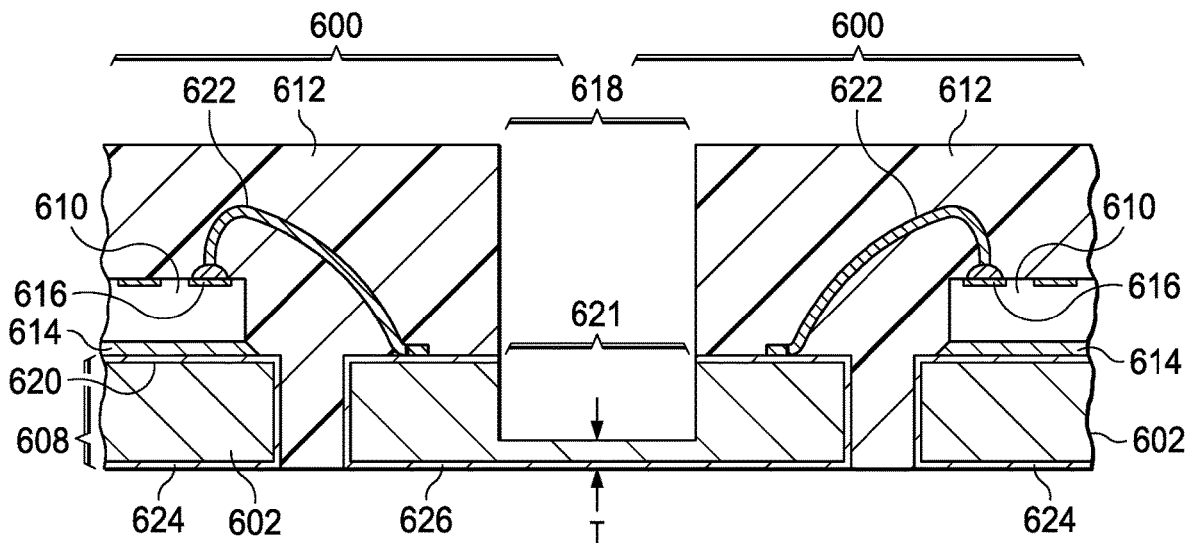
FIGS. 6A and 6B are cross sections that illustrate embodiment singulation steps for forming solder joint reinforcement tabs.
Figure 6B:
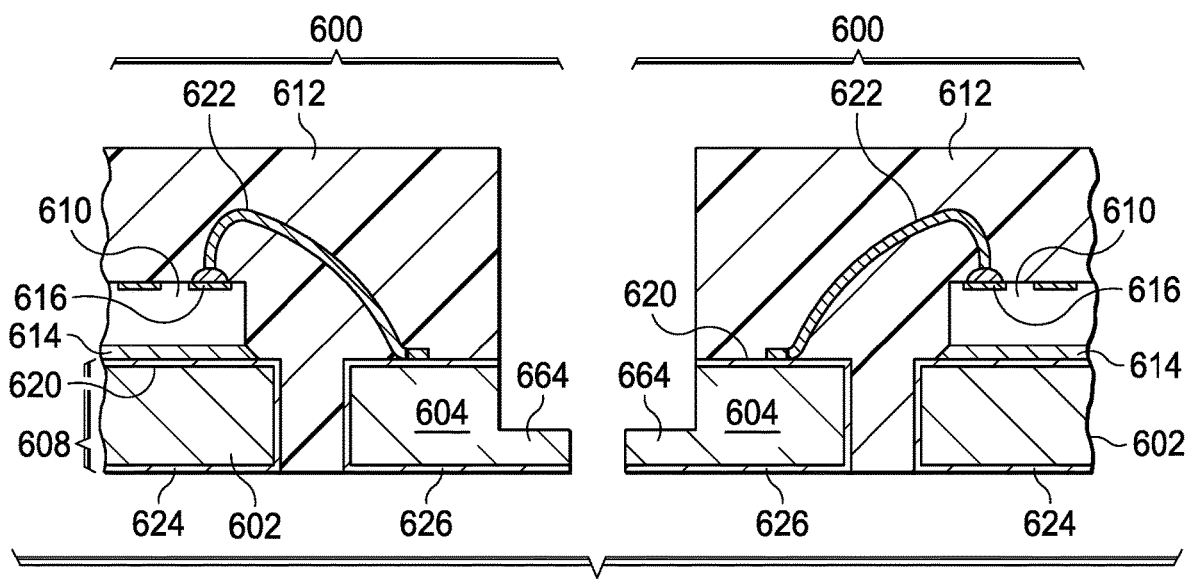

FIG. 6A is a cross section illustrating the results of step 502. Note that the reference labels used in FIGS. 6A-6B are similar for similar elements shown in FIGS. 1A-1B, for clarity. For example, the molding compound 612 in FIG. 6A corresponds to the molding compound 112 in FIG. 1A. FIG. 6A shows two PICs 600 joined together by a saw street 618. The molding compound 612 and the lead frame 608 are first cut in the saw street 618 from the frontside of the embedded lead frame strip 608, leaving a thin band 621 of saw street material 618. In this example embodiment, thin band 621 of the saw street 618 has a thickness "T" of approximately 40 μm+/−10 μm that remains after the first cut, connecting the bottom of the two PICs 600. In additional alternative embodiments, the thickness T of the band 621 can vary. In an example embodiment the first cut is made by a singulation saw blade, in one example the singulation saw blade used is 300 μm wide. The thin band 621 includes a thin portion of lead frame material (visible in FIG. 6A) and also molding compound material (not visible in the cross section of FIG. 6A) that is left after the first cut in saw street 618. The cut from the frontside of the lead frame strip exposes the base metal of the lead frame strip in the thin band 621 in the saw street 618, because the cut into the lead frame strip 608 removes the solderable metal 620 from the frontside of the lead frame strip where the cut is made. In FIG. 6A IC dies 610 are attached by die attach 614 to lead frame die mount pads 602. Terminals 616 on the dies 610 are electrically connected to lead frame leads 604 using wire bonds 622. The surfaces of the base metal of lead frame 608 are coated with solderable metal layer 620. Portions of the IC dies 610, lead frame die mount pads 602 and lead frame leads 604, and wire bonds 616 are encapsulated in molding compound 612 to form the embedded lead frame strip with PICs 600 joined together by saw streets 618. The backside surfaces of the die mount pad 602 and the lead frame leads 604 are not encapsulated by molding compound 612, and these exposed portions form external PIC terminals 624 and 626. Solder joints that will be made between these external PIC terminals 624 and 626 and leads on a PCB (not shown in FIGS. 6A-6B) are used to mount the PICs 600 on a PCB.

Returning to FIG. 5, in step 504 a second cut is made through the thin band of saw street 621. This step completely separates the PICs 600; that is, it is a singulation step. A thin ledge of saw street material 664 remains attached to and surrounds the bottom of the PICs 600. In an embodiment, the second cut is made from the backside of the lead frame strip. In one approach a singulation saw is used. In an alternative approach a laser cutting operation is used.

The results of step 504 in FIG. 5 is illustrated in the cross section of FIG. 6B. The center of the thin band 621 of the remaining saw street 618 is cut through in the second cutting step, completing singulation of the PICs 600. The second cut is narrower than the first cut in step 502. Following the singulation, the thin ledge 664 of saw street material remains attached to and surrounds the bottom of the PICs 600. In an example embodiment a singulation saw was used to make the second cut. In an example embodiment, a thin singulation blade used to make this cut is about 200 μm wide. In an alternative embodiment, laser cutting can be used. After this second cutting, the ledge 664 of the remaining saw street material attached to each PIC has a length shown as L in FIG. 6B that is about 50 μm+/−20 μm long measured from an outside boundary of the PIC and the ledge 664 has a thickness T shown in FIG. 6A that is about 40 μm+/−10 μm thick. The frontside (the upper surface as drawn in the figures) of the embedded lead frame strip is typically supported when the thin remaining band 623 is cut through from the backside (the lower surface of the leadframe strip as drawn in the figures). One such means of support is a tape.

As seen in FIG. 6B, the embodiments include a solder joint reinforcement tab formed in ledge 664 for the leads 626 of the PICs 600. As is further described hereinbelow, the solder joint reinforcement tabs provide additional area of the solderable metal layer 620 to provide increased wettable area for solder to form a reliable solder joint between the external terminals of the PIC and a PCB. Note that the portions of the solder joint reinforcement tabs in ledge 664 that form surfaces due to the first cutting operation and the second cutting operation of the embodiments are not covered by solderable metal layer 620, as the cutting operations expose the base metal of the lead frame strip 608.

FIGS. 7A-7E illustrate in a series of views the method of forming an embodiment. Note that in FIGS. 7A-7E, similar reference labels are used for similar elements shown in FIGS. 6A-6B, for clarity. For example, molding compound 712 corresponds to molding compound 612 in FIGS. 6A-6B.

Figure 7A:
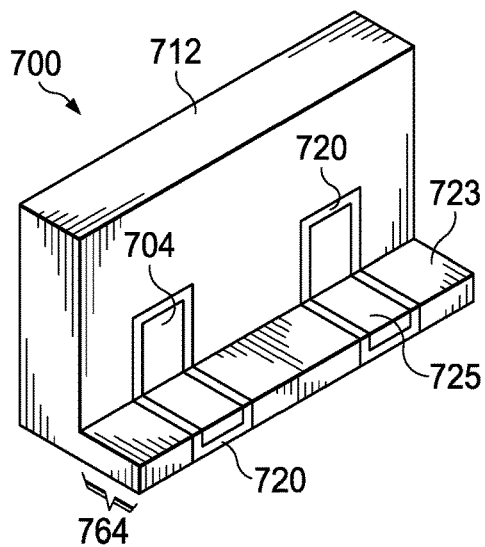
FIGS. 7A through 7E illustrate in a series of views a method embodiment for forming horizontal solder joint reinforcement tabs and for forming reinforced horizontal solder joints.

FIG. 7A is a perspective view showing the sidewall of the PIC 700 after the singulation process. The ledge 764 of saw street material surrounding the base of the PICs 700 is comprised of solder joint reinforcement tabs (SJRTs) 725 with portions of the molding compound 723 left between the SJRTs 725.

Referring again to FIG. 5, in step 506 the molding compound material 723 remaining between the SJRTs 725 is removed.

Figure 7B:
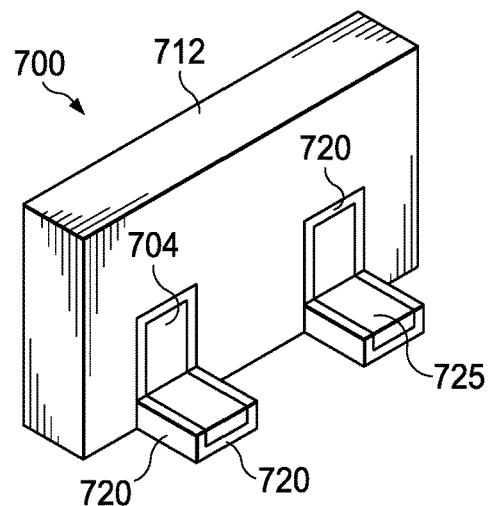

FIG. 7B illustrates in a perspective view one embodiment after performing the step 506 in FIG. 5. The remaining molding compound material 723 (see FIG. 7A) between SJRTs 725 may be removed by laser cutting or may be removed by applying pressure to the molding compound portions 723 and breaking them off.

In FIG. 7B, the SJRTs 725 are shown with the solderable metal layer 720 on portions of the SJRTs. This is further shown in a right side view and a front side view of the PIC 700 illustrated in FIGS. 7C-7D, respectively.

Figure 7C:
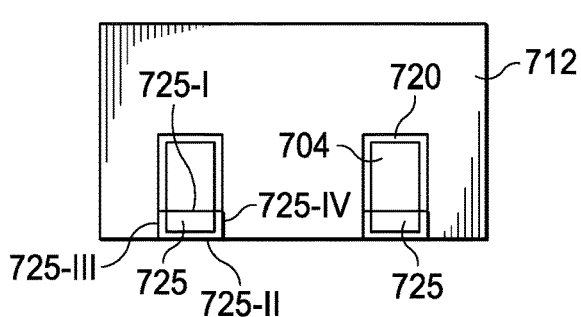
Figure 7D:
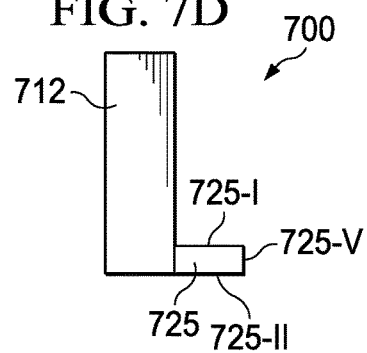

In FIG. 7C, the PIC 700 in the perspective view of FIG. 7B is shown in a right side view. In FIG. 7C, the view looks onto the end portions of the SJRTs 725 (see FIG. 7B). As shown in FIG. 7C, the SJRTs 725 have a first side labeled 725-I that corresponds to the frontside portion of the lead frame strip where base metal was exposed by the first cutting operation in step 502. The first side extends longitudinally in a first direction away from the periphery of the base of PIC 700. An opposing second side 725-II is parallel to the first side and is covered by the solderable metal 720, the second side corresponds to the backside surface of the lead frame strip 708. A third side 725-III is oriented in a second direction perpendicular to the first direction of the first side 725-I and is covered by the solderable metal layer 720, and an opposite fourth side 725-IV is parallel to the third side 725-III and also covered by the solderable metal layer 720. A fifth side of the SJRTs 725, the end portion of SJRT 725 formed by the second cutting operation of step 504, is labeled 725-V in the front side view in FIG. 7D. As shown in FIGS. 7B and 7C, this fifth side is partially covered by the solderable metal layer 720, and also includes base metal of the lead frame strip 708 that is exposed by the second cutting operation. Because the SJRTs 725 extend away from the PIC in a direction parallel to the base of the PIC 700, these SJRTs 725 can be described as "horizontal SJRTs" relative to the PIC 700.

Figure 7E:
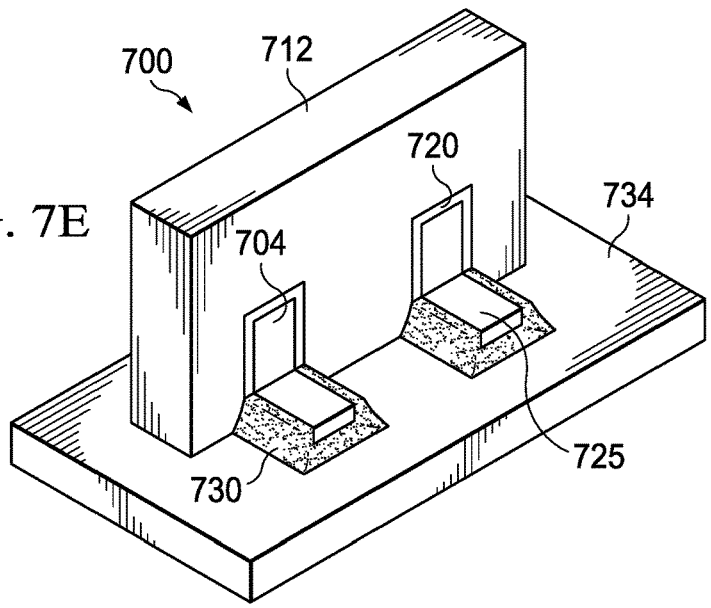

FIG. 7E shows in a projection view the PIC 700 including the SJRTs 725 after it is soldered to a PCB 734. The bottom surface and sides of the SJRTs 725 are coated with solderable material (not visible in FIG. 7E), so solder readily forms solder joints to the bottom and sides of the SJRTs 725. The solder joints 730 connect conductive leads (not visible as obscured in FIG. 7E) on the PCB 734 to the external terminals on the bottom of the PIC 700 (obscured in FIG. 7E, not visible, see 624, 626 in FIG. 6B for example) and also to the bottom and sides of the SJRTs 725. The enlarged solder joint 730 between the lead on the PCB 734 and the bottom and sides of the SJRTs 725 significantly strengthens the solder joints 730 (when compared to the solder joints formed on PIC leads made without use of the embodiments) and significantly reduces failure of the PCB mounted packaged integrated circuits. These advantages are accomplished with little additional cost.

Again referring to FIG. 5, an optional step 508 (illustrated in a series of perspective views in FIGS. 8A through 8D) may be performed. In FIGS. 8A through 8D, similar reference labels are used in for similar elements shown in FIGS. 6A-6B, for clarity. For example, molding compound 812 corresponds to molding compound 612 in FIGS. 6A-6B. FIGS. 8A-8D illustrate in a series of perspective views a process in which the SJRTs 825 are bent from an initial horizontal position to a vertical position, to end up alongside and against the sidewalls of the PICs 800. This approach reduces the footprint (board area of the PCB) of the PIC 800 and also increases the strength and reliability of the solder joint 830 (see FIG. 8D.) Because the SJRTs are bent upwards in the process, the SJRTs 825 can be described as "vertical SJRTs" with respect to PIC 800.

Figure 8A:
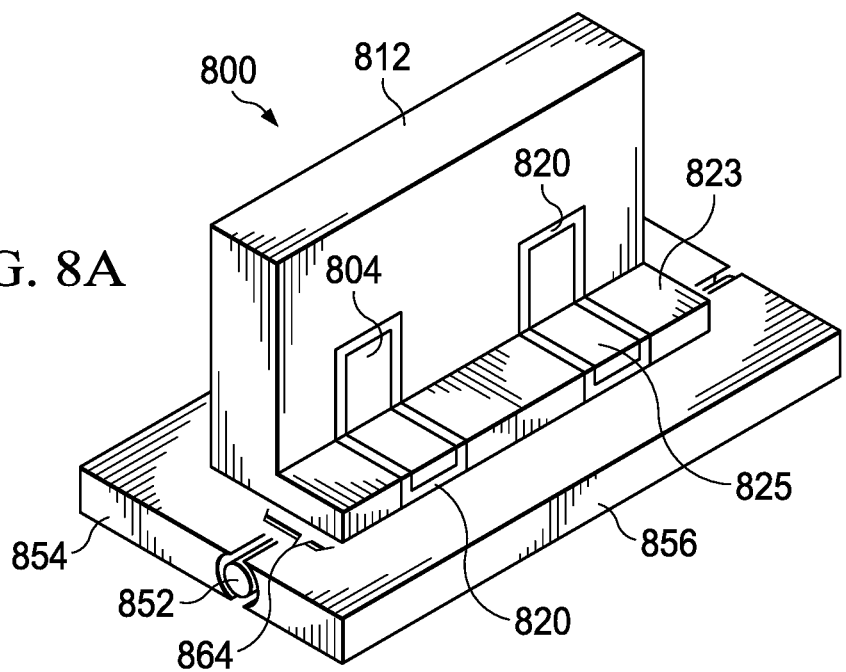
FIGS. 8A through 8D illustrate in a series of perspective views an additional method embodiment for forming vertical solder joint reinforcement tabs and for forming reinforced vertical solder joints.

In FIG. 8A the PIC 800 with the ledge 864 of saw street material surrounding the base of the PIC 800 is placed on a brake table 854. The ledge 864 of saw street material is comprised of SJRTs 825 with portions of molding compound 823 left between them.

Figure 8B:
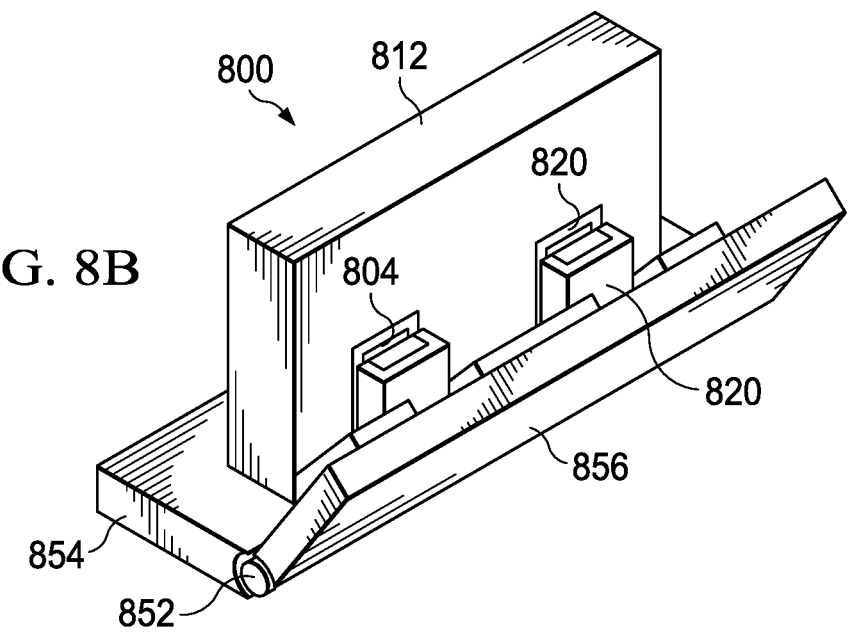

In FIG. 8B the brake 856 which is connected to the brake table 854 by a hinge 852 is raised to apply upward pressure to the ledge 864 of saw street material. This bends the SJRTs 825 from a horizontal orientation to a vertical orientation against the vertical sidewall of the PIC 800. The upward pressure also causes the portions of molding material 823 remaining between the SJRTs 825 to break off. In another alternative embodiment, if desired the portions of molding material 823 may be removed using laser cutting prior to bending the SJRTs 825.

Figure 8C:
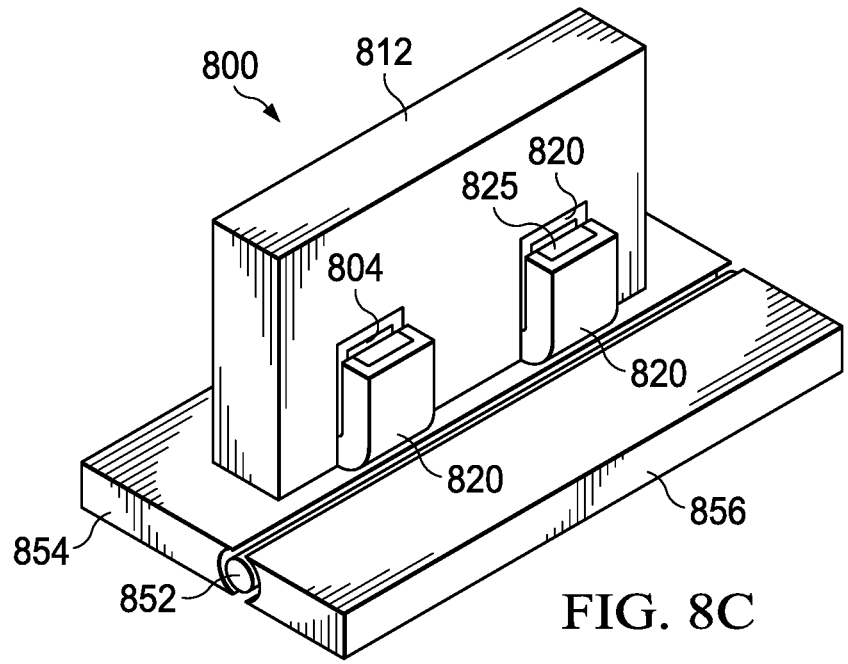

In FIG. 8C, the PIC 800 is shown after the bending operation is complete. The SJRTs 825 are shown now oriented vertically and lying alongside the sidewall of PIC 800. The vertical bottom surface and sides of the SJRTs 825 are coated with the solderable layer 820.

Figure 8D:
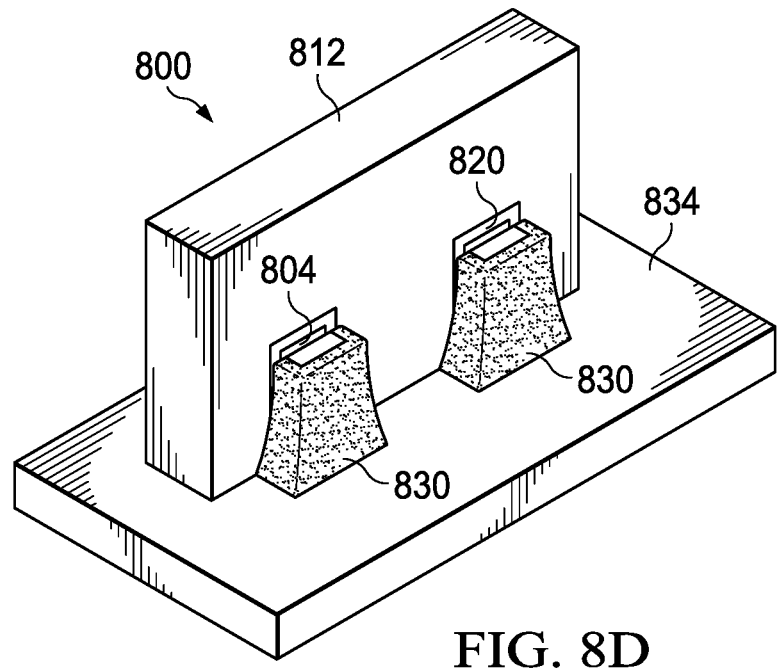

As is illustrated in FIG. 8D, when the PIC 800 with the vertical SJRTs 825 is soldered to leads on a PCB 834, a significantly taller solder joint 830 is formed. The increased height of the solder joint 830 provides increased strength and reliability.

The described examples presented herein to illustrate the embodiments show QFN integrated circuit packages. However, the embodiments are not so limited and the methods and arrangements of the embodiments can be applied to other package types where increased solder joint reliability is desired.

Modifications are possible in the described embodiments, and other alternative embodiments are possible within the scope of the claims.

What is claimed is:

1. A method for forming an integrated circuit (IC) package, comprising:
providing a lead frame strip of lead frame material having a first side and a second side opposite the first side with integrated circuit (IC) dies attached to the first side of the lead frame strip and covered in molding compound material, the integrated circuit dies spaced apart by saw street regions;
from the first side of the lead frame strip, in a saw street between ones of the IC dies, making a first cut of a first width through the molding compound and into the first side of the lead frame strip, leaving a band of the lead frame material and molding compound material in the saw street between adjacent IC dies;
making a second cut of a second width that is less than the first width through the band of the lead frame material and molding compound material in the saw street to form a ledge of saw street material comprised of a plurality of solder joint reinforcement tabs separated by molding compound material; and
removing the molding compound material from between the solder joint reinforcement tabs such that the solder joint reinforcement tabs extend from a periphery of the IC package.

2. The method of claim 1, in which the band of the lead frame material and molding compound material has a thickness in a range of 30 μm to 50 μm.

3. The method of claim 1, in which the solder joint reinforcement tabs have a length extending longitudinally in a first direction from a periphery of the IC package in a range of about 30 μm to 70 μm, and the solder joint reinforcement tabs have a first side oriented in the first direction, a second side opposite to and in parallel with the first side, a third side oriented in a second direction perpendicular to the first side, a fourth side opposite to and in parallel with the third side, and a fifth side forming an end portion of the solder joint reinforcement tab, the second side, third side and the fourth side being covered by a solderable metal layer, and the first side and the fifth side being partially covered by the solderable metal layer.

4. The method of claim 3, further including bending the solder joint reinforcement tabs into a vertical orientation against a side of the molding compound of the packaged integrated circuit.

5. The method of claim 1, in which the packaged integrated circuit is a Quad Flat No Lead (QFN) packaged integrated circuit.

6. The method of claim 1, in which the solder joint reinforcement tab has a thickness in a range of about 30 μm to 50 μm.

7. The method of claim 1, in which the solder joint reinforcement tab has a length extending longitudinally in the first direction from a periphery of the IC package of about 30 μm to 70 μm.

8. The method of claim 1, in which the solder joint reinforcement tab projects horizontally from a base of the IC package.

9. The method of claim 1, in which the solder joint reinforcement tab extends alongside a vertical sidewall of the IC package.

10. A method for forming an integrated circuit (IC) package, comprising:
attaching an IC die to a die mount pad and electrically connecting the IC die to a lead;
covering the IC die and portions of the lead using a molding compound; and
sawing a side of the molding compound to form a side of the IC package, the side of the IC package including a solder joint reinforcement tab projecting from the side of the IC package, the solder joint reinforcement tab has a first side oriented in the first direction, a second side opposite to and in parallel with the first side, a third side oriented in a second direction perpendicular to the first side, a fourth side opposite to and in parallel with the third side, and a fifth side forming an end portion of the solder joint reinforcement tab, the second side, third side and the fourth side being covered by a solderable metal layer, and the first side and the fifth side being partially covered by the solderable metal layer.

11. The method of claim 10, in which the IC package is one selected from a Small Outline No-Lead (SON) package and a Quad Flat No-Lead (QFN) package.

12. The method of claim 10, in which the first side and the fifth side includes a base metal of the lead visible.

13. The method of claim 10, in which the solderable metal layer includes at least one selected from nickel, gold, palladium, and alloys thereof.

14. The method of claim 10, in which the base metal includes copper or a copper alloy.

15. The method of claim 10, in which the solder joint reinforcement tab has a thickness in a range of about 30 μm to 50 μm.

16. The method of claim 10, in which sawing a side of the molding compound includes sawing from a top of the side and then sawing from a bottom of the side using blades of different thickness.

* * * * *